(12) United States Patent
Sze et al.

(10) Patent No.: US 6,297,123 B1
(45) Date of Patent: Oct. 2, 2001

(54) METHOD OF PREVENTING NECK OXIDATION OF A STORAGE NODE

(75) Inventors: Jhy-Jyi Sze, Tainan; Chuan-Fu Wang, Sanchung, both of (TW)

(73) Assignee: United Microelectronics Corp., Hsin-chu (TW)

( * ) Notice: Subject to any disclaimer, the term of this patent is extended or adjusted under 35 U.S.C. 154(b) by 0 days.

(21) Appl. No.: 09/725,026

(22) Filed: Nov. 29, 2000

(51) Int. Cl.$^7$ .................................................. H01L 21/20
(52) U.S. Cl. ............................ 438/396; 438/3; 438/255; 438/398
(58) Field of Search .............................. 438/3, 240, 396, 438/397, 398, 253, 254, 255

(56) References Cited

U.S. PATENT DOCUMENTS 5,918,123 * 6/1999 Yang ...................... 438/253
6,046,059 * 4/2000 Shen et al. .................. 438/3
6,218,258 * 4/2001 Joo ......................... 438/396

\* cited by examiner

*Primary Examiner*—Tuan H. Nguyen
(74) *Attorney, Agent, or Firm*—Winston Hsu

(57) ABSTRACT

A silicon oxide layer is formed on a substrate surface of a semiconductor wafer. A node contact is formed in the silicon oxide layer. A storage node is formed on the silicon oxide layer and connects to the node contact. An ion implantation process is performed as a surface process on the silicon oxide layer. A silicon nitride layer is subsequently formed on the surfaces of the silicon oxide layer and the storage node. Finally, a high-temperature oxidation process is performed. The surface process reduces the difference in the incubation time for the silicon nitride layer deposited on the silicon oxide layer and on the surface of the storage node. The surface process also relieves problems associated with the nonuniformity in thickness of the silicon nitride layer. Neck-oxidation at the interface of the storage node and the node contact is thus prevented.

12 Claims, 3 Drawing Sheets

METHOD OF PREVENTING NECK OXIDATION OF A STORAGE NODE

BACKGROUND OF THE INVENTION

1. Field of the Invention

The present invention relates to a method of fabricating a storage node, and more particularly, to a method of fabricating a storage node while simultaneously preventing neck-oxidation phenomena in the storage node.

2. Description of the Prior Art

A dynamic random access memory (DRAM) cell is composed of a pass transistor and a storage capacitor. The storage capacitor, disposed on the surface of a silicon oxide layer above a semiconductor wafer substrate, comprises a top electrode, a capacitor dielectric layer, and a storage node connected to a node contact. In the manufacturing processes for DRAM, an oxide-nitride-oxide (ONO) process is most commonly used to form the capacitor dielectric layer.

Please refer to FIG. 1 and FIG. 2. FIG. 1 and FIG. 2 are schematic diagrams of a prior art method of fabricating a storage node 20 of a DRAM cell. As shown in FIG. 1, a low-pressure chemical vapor deposition (LPCVD) process is performed to form a silicon oxide layer 14 on the surface of a substrate 12 of a semiconductor wafer 10. A silicon oxide layer 14, with a thickness of between six thousand and eight thousand angstroms (Å), is used to isolate the MOS transistor (not shown). Then, a lithographic process is performed on the surface of the silicon oxide layer 14 to define the pattern of a node contact 16, and a node contact hole is formed in the silicon oxide layer 14 using an anisotropic dry etching process. An LPCVD process is performed on the surface of the semiconductor wafer 10 to form a conductive layer 18 of amorphous silicon (α-Si). The conductive layer 18 covers the node contact hole to form a node contact 16. The conductive layer 18 has a thickness between eight thousand and ten thousand angstroms to provide a sufficient surface area for storing charge.

As shown in FIG. 2, a lithographic process is performed on the surface of the conductive layer 18 to define the pattern of a storage node 20. An anisotropic dry etching process is performed along the pattern to remove the excess regions of the conductive layer 18 down to the surface of the silicon oxide layer 14, forming the storage node 20. In the next step, an ultra high vacuum chemical vapor deposition (UHV-CVD) process is performed to uniformly form a polysilicon layer 22 with a hemispherical grain (HSG) structure on the surface of the storage node 20. The HSG structure is used to increase the surface area for storing charge and reduce the charge refresh rate of the DRAM.

A capacitor dielectric layer (not shown) is formed on the surface of the polysilicon layer 22. It is used to perform an ONO process to form a capacitor dielectric layer in a three-layer structure comprising a native oxide layer, a silicon nitride layer, and an oxygen-containing silicide layer. A native oxide layer (not shown), with a thickness of between ten and fifty angstroms, is first formed on the HSG structure surface of the polysilicon layer 22. Then, a silicon nitride layer 24, with a thickness of about fifty angstroms, is formed on the surfaces of the native oxide layer and the silicon oxide layer 14. Finally, a high-temperature healing process is performed on the silicon nitride layer 24 in an oxygen-containing environment to repair the structure of the silicon nitride layer 24 and form an oxygen-containing silicide layer (not shown) on the surface of the silicon nitride layer 24. The thickness of the oxygen-containing silicide layer is between forty and eighty angstroms.

The incubation times for the deposition of the silicon nitride layer 24 on the silicon oxide layer 14 and on the native oxide layer of storage node 20 are different. Hence, the silicon nitride layer 24 deposits to a thickness of nearly fifty angstroms on the surface of the storage node 20, while the thickness of the silicon nitride layer 24 deposited on the silicon oxide layer 14 is only twenty to thirty angstroms. The thickness of the silicon nitride layer 24 on the silicon oxide layer 14 is sorely insufficient, which results in oxygen penetrating the silicon nitride layer 24 and entering the silicon oxide layer 14. Oxygen diffuses through the polysilicon grain boundaries of the node contact 16, and simultaneously oxidizes the grains and the grain boundaries of the polysilicon. This leads to neck-oxidation 26 occurring at the interface of the storage node 20 and the node contact 16.

Consequently, the prior art method of fabricating the DRAM storage node 20 not only produces neck-oxidation and volume-expansion problems at the interface of the storage node 20 and the node contact 16, but tilts the storage node 20 and cuts off the connection of the storage node 20 and the node contact 16. The neck-oxidation situation is even more serious when the thickness of the capacitor dielectric layer is made thinner and thinner.

SUMMARY OF THE INVENTION

It is therefor an object of the present invention to provide a method of fabricating the storage node of a DRAM cell, while preventing neck-oxidation phenomena.

In a preferred embodiment, the present invention provides a method of fabricating the storage node on a semiconductor wafer, the semiconductor wafer comprising a substrate. The method forms a silicon oxide layer on the surface of the substrate, and then forms a node contact in the silicon oxide layer. A storage node formed on the silicon oxide layer connects to the node contact. During an ONO process of making a capacitor dielectric layer, an ion implantation process is performed as a surface process on the silicon oxide layer. A silicon nitride layer is then formed on the surfaces of the silicon oxide layer and the storage node. At last, a high-temperature oxidation process is performed.

It is an advantage of the present invention that the surface process is performed which reduces the difference in the incubation times for the deposition of a silicon nitride layer on the silicon oxide layer and for the deposition on the surface of the storage node. The problem of nonuniformity in the thickness of the silicon nitride layer is hence improved, and neck-oxidation is prevented at the interface of the storage node and the node contact.

These and other objectives of the present invention will no doubt become obvious to those of ordinary skill in the art after reading the following detailed description of the preferred embodiment, which is illustrated in the various figures and drawings.

DETAILED DESCRIPTION OF THE PREFERRED EMBODIMENT

Figure 1:
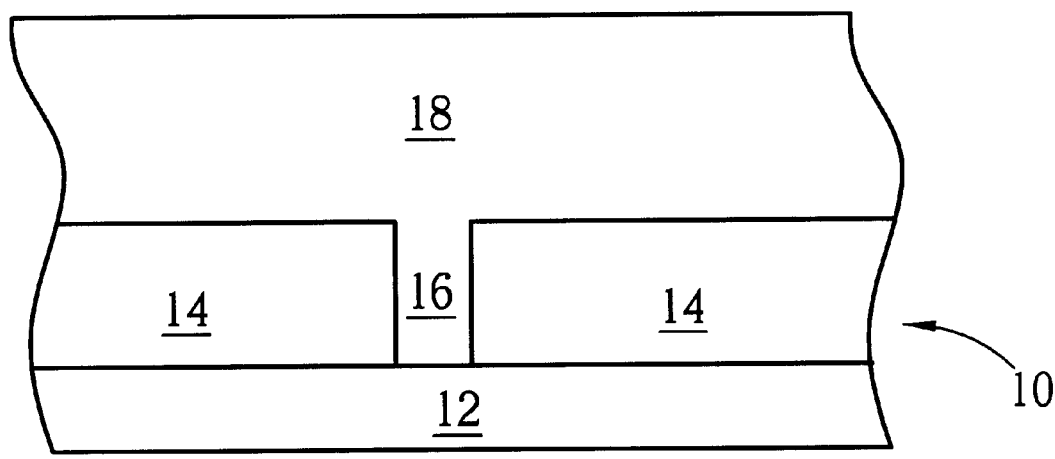
FIG. 1 and FIG. 2 are schematic diagrams of a prior art method of fabricating a storage node of a DRAM cell.
Figure 2:
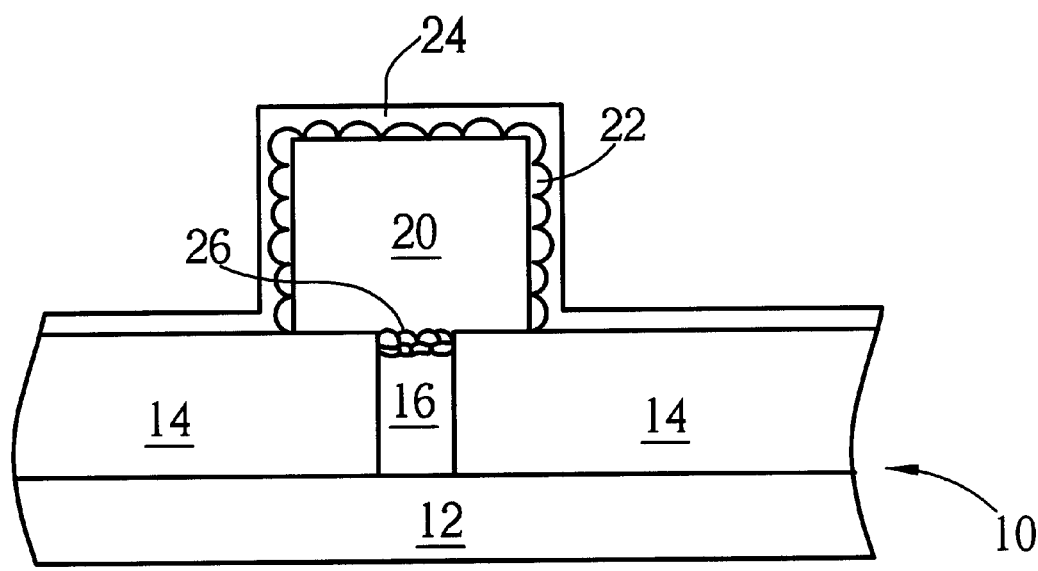
Figure 3:
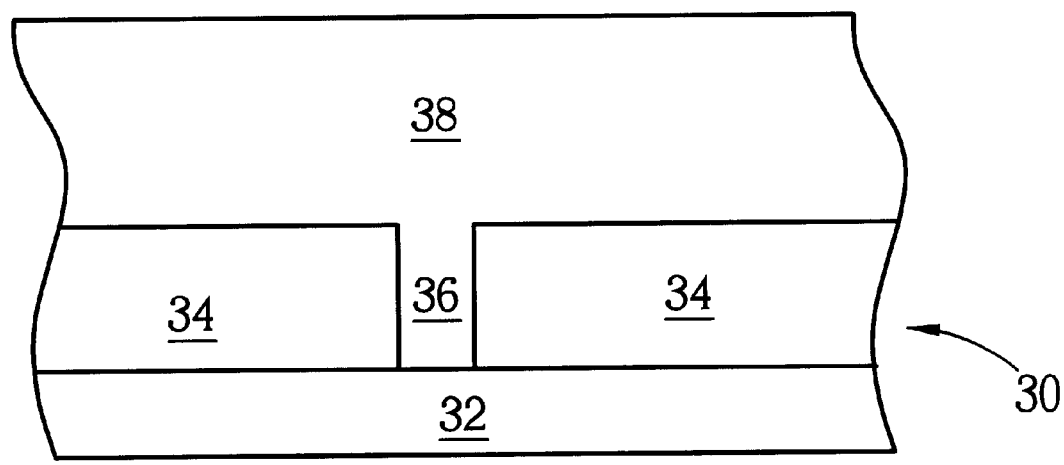
FIG. 3 to FIG. 5 are schematic diagrams of fabricating a storage node of a DRAM cell according to the present invention.
Figure 4:
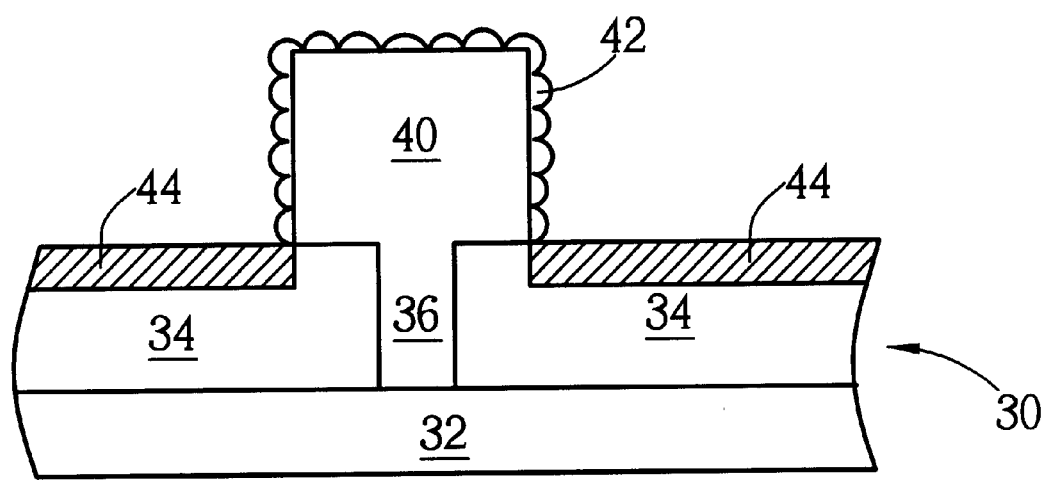
Figure 5:
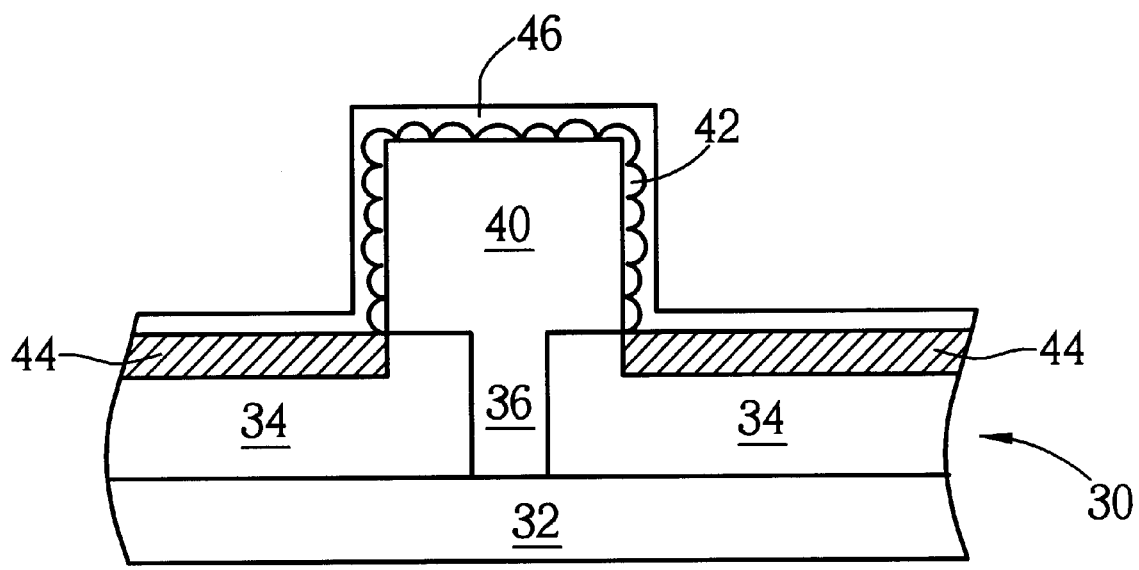

Please refer to FIG. 3 to FIG. 5. FIG. 3 to FIG. 5 are schematic diagrams of fabricating a storage node 40 of a DRAM cell according to the present invention. As shown in FIG. 3, an LPCVD process is performed to form a silicon oxide layer 34 on the surface of a substrate 32 of a semiconductor wafer 30. The silicon oxide layer 34, with a thickness between six thousand and eight thousand angstroms, is used to isolate a MOS transistor of the DRAM cell (not shown). Then, a lithographic process is performed on the surface of the silicon oxide layer 34 to define the pattern of a node contact 36, and a node contact hole is formed in the silicon oxide layer 34 using an anisotropic dry etching process. An LPCVD process is performed on the surface of the semiconductor wafer 30 to form a conductive layer 38 of amorphous silicon. The conductive layer 38 covers the node contact hole to form the node contact 36. The conductive layer 38 has a thickness of between eight thousand and ten thousand angstroms to provide a sufficient surface area for storing charge.

As shown in FIG. 4, a lithographic process is performed on the surface of the conductive layer 38 to define the pattern of a storage node 40. An anisotropic dry etching process is performed along the pattern to remove excess regions of the conductive layer 38 down to the surface of the silicon oxide layer 34, forming the storage node 40. In the next step, a UHV-CVD process is performed to uniformly form a polysilicon layer 42 with a hemispherical grain (HSG) structure on the surface of the storage node 40. The HSG structure is used to increase the surface area for storing charge and reduce the charge refresh rate of the DRAM.

A capacitor dielectric layer (not shown) is formed on the surface of the polysilicon layer 42. It is used to perform an ONO process to form a capacitor dielectric layer with a three-layered structure comprising a native oxide layer, a silicon nitride layer, and an oxygen-containing silicide layer. A native oxide layer (not shown), with a thickness of between ten and fifty angstroms, is first formed on the HSG structure surface of the polysilicon layer 42. An ion implantation process is performed on the surface of the silicon oxide layer 34 to form doped areas 44. The ion implantation process utilizes silicon atoms or silicon ions as dopants, and forms a silicon-rich structure of a silicon oxide compound on the surface of the silicon oxide layer 34 to reduce the incubation time of a silicon nitride layer 46 that is deposited onto it in a following process. In addition, the dopants may be nitrogen atoms or nitrogen ions, which form numerous nitrogen-containing dangle bonds and unsaturated bonds. The incubation time for the silicon nitride layer 46 deposited on the surface of the silicon oxide layer 34 is also reduced in this case, and the thickness of the silicon nitride layer 46 is increased at the same time.

As shown in FIG. 5, the silicon nitride layer 46 with a thickness of about fifty angstroms is then formed on the surfaces of the native oxide layer and the silicon oxide layer 34. Finally, a high-temperature healing process is performed on the silicon nitride layer 46 in an oxygen-containing environment, and an oxygen-containing silicide layer (not shown) is formed on the surface of the silicon nitride layer 46. The thickness of the oxygen-containing silicide layer is between forty and eighty angstroms. The fabricating process of the storage node 40 according to the present invention is then finished.

In the ONO process, the present invention performs doping on the surface of the silicon oxide layer 34 before the silicon nitride layer 46 is deposited. The incubation time for the deposition of the silicon nitride layer 46 on the surface of the silicon oxide layer 34 is thereby reduced, utilizing silicon atoms or silicon ions as dopants, or utilizing nitrogen atoms or nitrogen ions as dopants. Both the silicon nitride layers on the silicon oxide layer 34 and the storage node 40 achieve a sufficient deposition thickness, and oxygen is prevented from penetrating the silicon oxide layer 34 and oxidizing the polysilicon of the node contact 36.

In contrast to the prior art, the method of fabricating a storage node of a DRAM cell according to the present invention improves on the process design to prevent neck-oxidation resulting from an insufficiently thick silicon nitride layer. A surface process is performed on the silicon oxide layer in the ONO process to reduce the incubation time of the silicon nitride layer that is subsequently deposited on it, and to ensure that the silicon nitride layer has a sufficient deposition thickness. The neck-oxidation phenomenon of the storage node is hence prevented.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of preventing neck-oxidation phenomena in a storage node of a capacitor element of a dynamic random access memory (DRAM) cell, a node contact of the storage node disposed on a semiconductor wafer, the semiconductor wafer comprising a silicon substrate, a silicon oxide layer above the surface of the silicon substrate, and a node contact in the silicon oxide layer, the node contact connected to the storage node, the method comprising:

performing a surface process on the silicon oxide layer, the surface process utilizing an ion implantation process; and forming a silicon nitride layer on the surfaces of the silicon oxide layer and the storage node;

wherein the surface process will decrease both the difference in the incubation time and the difference in the thickness between the silicon nitride layer formed above the silicon oxide layer surface and the storage node surface, and prevents the neck-oxidation phenomenon at the interface of the storage node and the node contact.

2. The method of claim 1 wherein the surface of the storage node is rough and comprises a plurality of hemispherical grain (HSG) structures.

3. The method of claim 1 wherein dopants in the ion implantation process are silicon atoms or silicon ions, the dopants forming a silicon-rich structure of a silicon oxide compound on the surface of the silicon oxide layer.

4. The method of claim 3 wherein the energy in the ion implantation process is less than 40 keV, and the dosage of dopants is greater than $2 \times 10^{15}$ cm$^{-2}$.

5. The method of claim 1 wherein dopants in the ion implantation process are nitrogen atoms or nitrogen ions.

6. A method of fabricating a cell dielectric layer of a capacitor, the method comprising:

providing a semiconductor wafer, the semiconductor wafer comprising a substrate, a silicon oxide layer disposed above the substrate surface, a node contact in the silicon oxide layer and approximately level with the top surface of the silicon oxide layer, and a storage node disposed above the silicon oxide layer and connected to the node contact;

performing a surface process on the silicon oxide layer, the surface process utilizing an ion implantation process;

forming a silicon nitride layer on the surfaces of the silicon oxide layer and the storage node; and performing a high-temperature oxidation process.

7. The method of claim 6 wherein the surface of the storage node is rough and comprises a plurality of hemispherical grain (HSG) structures.

8. The method of claim 7 wherein the surface of each HSG structure comprises a native oxide layer, and the thickness of the native oxide layer is approximately 10 to 50 angstroms (Å).

9. The method of claim 6 wherein dopants in the ion implantation process are silicon atoms or silicon ions, the dopants forming a silicon-rich structure of a silicon oxide compound on the surface of the silicon oxide layer.

10. The method of claim 9 wherein the energy in the ion implantation process is less than 40 keV, and the dosage of dopants is greater than $2 \times 10^{15}$ cm$^{-2}$.

11. The method of claim 6 wherein dopants in the ion implantation process are nitrogen atoms or nitrogen ions.

12. The method of claim 6 wherein the surface process decreases both the incubation time difference and the thickness difference between the silicon nitride layer formed above the silicon oxide layer surface and the storage node surface, and prevents neck-oxidation phenomena at the interface of the storage node and the node contact during the high-temperature oxidation process.

* * * * *